United States Patent
Reamon et al.

(10) Patent No.: US 6,975,189 B1
(45) Date of Patent: Dec. 13, 2005

(54) ON-CHIP MULTILAYER METAL SHIELDED TRANSMISSION LINE

(75) Inventors: Alan E. Reamon, Woodland Hills, CA (US); Lloyd F. Linder, Agoura Hills, CA (US); Erick M. Hirata, Torrance, CA (US); Nick Elmi, Tempe, AZ (US)

(73) Assignee: TelASIC Communications, Inc., El Segundo, CA (US)

( * ) Notice: Subject to any disclaimer, the term of this patent is extended or adjusted under 35 U.S.C. 154(b) by 0 days.

(21) Appl. No.: 09/705,134

(22) Filed: Nov. 2, 2000

(51) Int. Cl.[7] .............................................. H01P 3/08

(52) U.S. Cl. ...................... 333/238; 333/243; 257/664; 257/728

(58) Field of Search ................................ 333/238, 243, 333/1; 257/664, 728

(56) References Cited

U.S. PATENT DOCUMENTS

| | | | |
|---|---|---|---|
| 4,673,904 A | * | 6/1987 | Landis ........................ 333/238 |
| 4,776,087 A | * | 10/1988 | Cronin et al. ........... 333/243 X |
| 5,408,053 A | * | 4/1995 | Young .................... 333/238 X |
| 5,438,167 A | * | 8/1995 | McClanahan et al. .. 333/238 X |
| 5,574,415 A | * | 11/1996 | Peterson .................... 333/238 |
| 5,729,047 A | * | 3/1998 | Ma ............................. 257/664 |
| 5,965,935 A | | 10/1999 | Bahl et al. |
| 6,000,120 A | * | 12/1999 | Arledge et al. ......... 333/238 X |
| 6,133,621 A | * | 10/2000 | Gaibotti et al. ......... 257/664 X |
| 6,569,757 B1 | * | 5/2003 | Weling et al. .......... 257/664 X |

FOREIGN PATENT DOCUMENTS

EP       0 867929 A3    4/1999

OTHER PUBLICATIONS

Title: Theorectical Analysis of Microshield Transmission Lines with Dual-plane Discontinuities, 9th Annual Review of Progress in Applied Computational Electromagnetics at the Naval Postgraduate School, Monterey, CA, USA, Mar. 22-26, 1993. Conference Proceedings.

* cited by examiner

*Primary Examiner*—Benny Lee
(74) *Attorney, Agent, or Firm*—Morrison & Foerster LLP

(57) ABSTRACT

Multi-layer metal-shielded monolithic transmission lines are formed in side-by-side arrangement by depositing parallel planar thin film, conductive layers, separated by nonconductive separator layers to form a stack of alternating conductive and nonconductive layers. The conductive layers form a top and a bottom conductive plane and establish a mutually registered selected width of the stack. A center conductive layer has laterally spaced apart conductive strips separated by nonconductive spacer layers. The two laterally terminal of the conductive strips are spaced at the selected width. Each of the nonconductive separator layers provides a plurality of elongated vias between the two lateral terminals of the three conductive strips and the conductive planes. The vias are filled as each next metal deposition is applied for electrically interconnecting the conductive strips and planes so as to form a monolithic conductive shield about the centermost signal carrying conductor of the three conductive strips, providing electrical isolation in a coaxial arrangement.

3 Claims, 3 Drawing Sheets

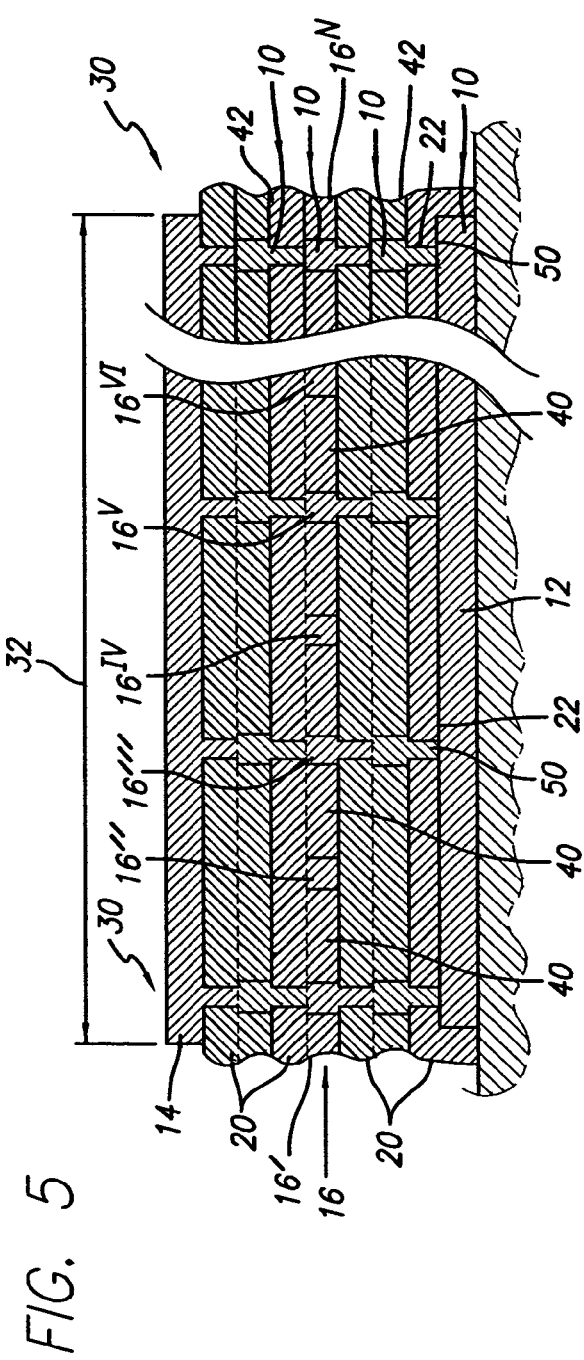
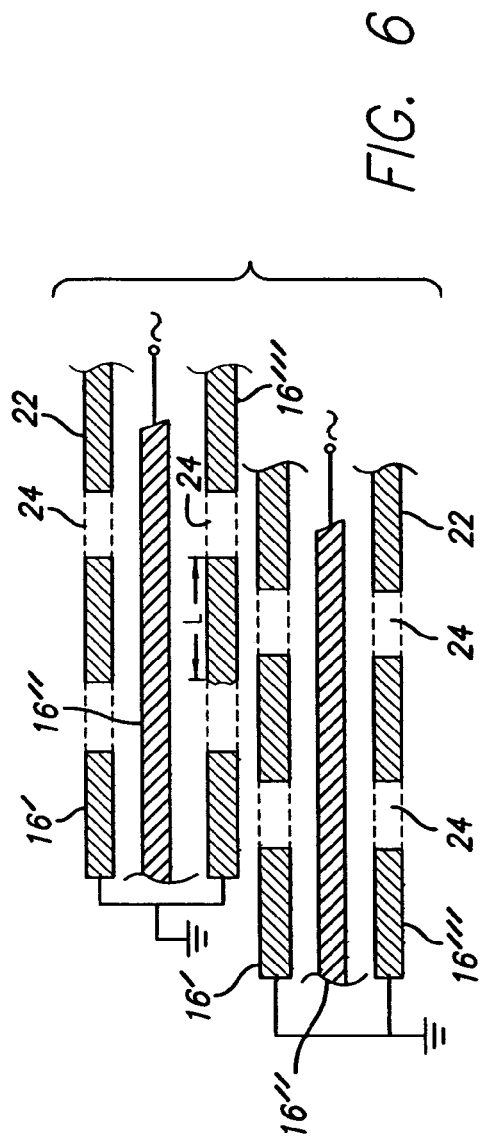

_US 6,975,189 B1_

ON-CHIP MULTILAYER METAL SHIELDED TRANSMISSION LINE

BACKGROUND OF THE INVENTION

1. Field of Invention

This invention relates to electrical circuit and systems. More specifically, the present invention relates to transmission lines.

2. Description of the Related Art

In electrical circuit technology the advantages of a shielded signal path are well known. In transmission lines shielded conductors are widely used. The coaxial cable is an example of an improved transmission line having well known advantages stemming from its symmetry properties.

In microcircuits it has been long desired to achieve the advantages of shielded transmission lines, but planar fabrication techniques have not been acceptable to achieve this until now. The closest prior art, are the well-known on-chip stripline and the microstrip structures. These transmission line structures are not typically isolated well from surrounding electromagnetic fields. Improvements in isolation have been achieved through physical separation from neighboring circuit elements and signal paths. However, this approach takes up valuable surface area on the chip.

There is a need for an isolated, shielded conductor used on-chip without consuming an inordinate amount of space. More specifically, there is a need for an isolated, shielded conductor used on-chip at radio frequencies (RF).

SUMMARY OF THE INVENTION

The need in the art is addressed by the on-chip multi-layer metal-shielded monolithic transmission line of the present invention. Generally, the inventive transmission line includes plural parallel planar thin film conductive layers and plural planar thin film nonconductive separator layers disposed such that each adjacent pair of the conductive layers is separated by a nonconductive layer to form a stack of alternating conductive and nonconductive layers.

In the illustrative embodiment, the invention is a planar structure with metal top and bottom planes and metal sidewalls produced by alternating thin film layers of conductors and insulators which are etched to successively build walls to a selected depth. Vias are filled with metal deposited so as to join adjacent metal layers. This four-sided metal "box" is fabricated with a metal conductor coaxially positioned to be shielded by the surrounding metal. Such structures may be constructed using standard planar technique in a side-by-side arrangement with or without common walls.

BRIEF DESCRIPTION OF THE DRAWING

FIG. 5 is an elevational section view of a 5 metal layer enablement of the present invention in a monolithic construction having multiple independent signal conductors.

FIG. 6 is a plan view of the present invention showing how elongated vias of the invention are staggered for signal isolation.

DETAILED DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
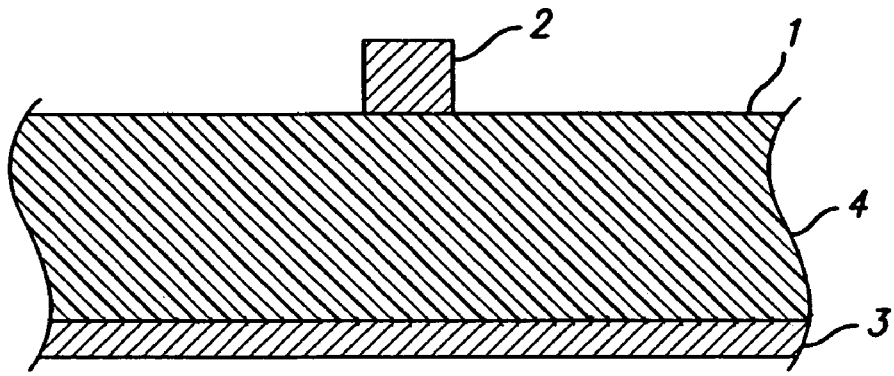
FIG. 1 is an elevational section view of a prior art stripline monolithic construction.
Figure 2:
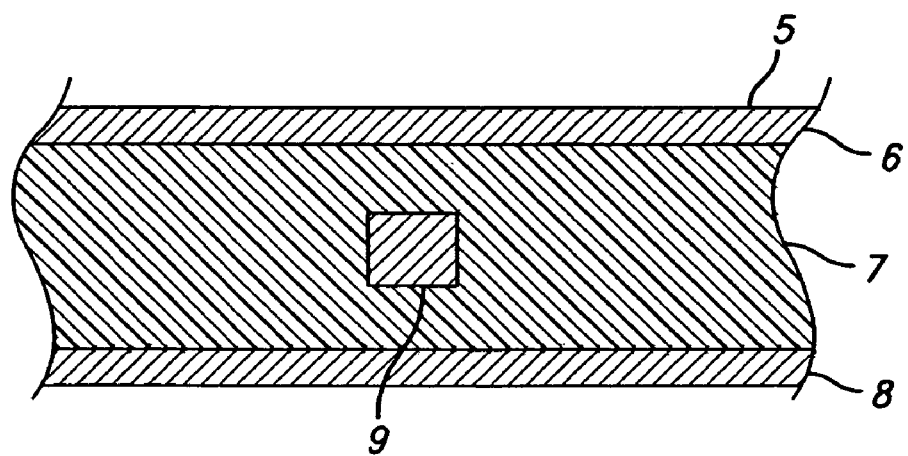
FIG. 2 is an elevational section view of a prior art microstrip monolithic construction.

FIGS. 1 and 2 depict elevational section views of the prior art microstrip line 1 and strip line 5 monolithic constructions respectively. Both of these constructions are well known in the planar fabrication and microcircuit technology. In FIG. 1, the strip line comprises a metal conductor 2 etched on top of an insulator 4, which in turn rests on a layer of conductor 3.

The stripline construction 5 shown in FIG. 2 comprises a pair of metal conductors 6 and 8 in spaced apart positions with one of the conductors 9 embedded within the insulation material 7. In both of these constructions, the only way to achieve field isolation is to space adjacent conductors apart. However, this uses an undesirable amount of surface area on the substrate to achieve such isolation.

Figure 3:
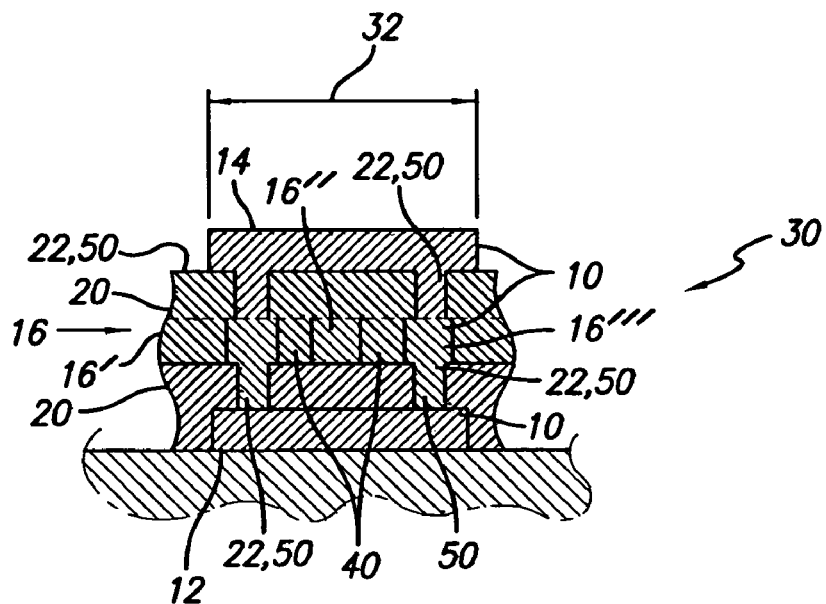
FIG. 3 is an elevational section view of a 3 metal layer enablement of the present invention in a monolithic construction of a single signal conductor.

Referring to FIG. 3, an on-chip three layer metal-shielded monolithic transmission line of the present invention comprises, in a simple embodiment, three parallel planar thin film, conductive layers 10 which are typically one micron thick condensates of Cu, Al, or Au placed by, for example, a physical vapor deposition process such as evaporation or sputtering. Each adjacent pair of the conductive layers 10 is separated by one of a plurality of planar thin film nonconductive separator layers 20, typically an oxide deposited or grown, to form a stack 30 of alternating conductive 10 and nonconductive 20 layers. An initial one 12 and a final one 14 of said conductive layers 10 form a top and a bottom conductive planes, the conductive planes establishing a mutually registered selected width 32 of the stack 30. A center one 16 of the conductive layers 10 comprises three laterally spaced apart conductive strips 16', 16" and 16"' separated laterally by a pair of non conductive spacer layers 40, the two laterally terminal 16' and 16"' of the three conductive strips 16', 16" and 16"' being spaced at approximately the selected width 32.

Each of the nonconductive separator layers 20 provides a plurality of vias 22 between the two laterally terminal 16' and 16"' of the three conductive strips 16', 16" and 16"' and the conductive planes 12, 14. The vias 22 are cut into the separator layers 20, typically by dry etching processes that are well known, and are thereafter filled with conductive material 50, usually as part of the next metal layer deposition, for electrically interconnecting conductive strips 16' and 16"' and the planes 12 and 14 so as to form a conductive side wall as part of a shield about the signal carrying centermost 16" the three conductive strips 16', 16" and 16"' for electrical isolation thereof. The center strip 16" can be made approximately one micron in width and in height by process techniques well known to the planar fabrication engineer.

Figure 4:
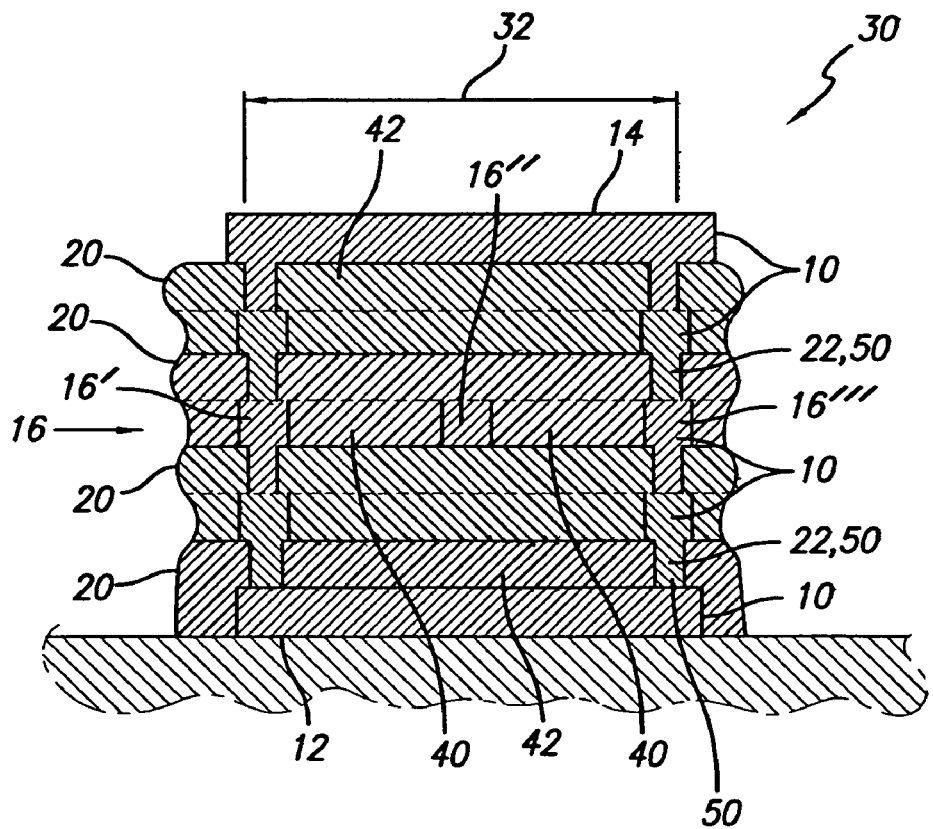
FIG. 4 is an elevational section view of a 5 metal layer enablement of the present invention in a monolithic construction of a single signal conductor.

Referring to FIG. 4, the above-described configuration may be further extended to include additional layers such as the 5 metal layer embodiment shown. In this further embodiment, the plurality of parallel planar thin film, conductive layers 10 are formed wherein each adjacent pair of the conductive layers is separated by one of the plurality of planar thin film nonconductive separator layers 20 to form the stack of alternating conductive and nonconductive said layers 30. The initial one 12 and final one 14 of conductive layers 10 form the top and bottom conductive planes as before, the conductive planes establishing the mutually registered selected width 32 of the stack. One of the conductive layers 16 between the top and the bottom conductive planes 12, 14, comprises three laterally spaced apart conductive strips 16', 16", 16''' separated by a pair of nonconductive laterally spaced apart spacer layers 40, the two laterally terminal 16', 16" of the three conductive strips being spaced approximately at the selected width 32 as in the previous embodiment.

Each of the other of the conductive layers 10 between the one of the conductive layers 16 and the top one of the conductive planes 14, and between the one of the conductive layers 16 and the bottom one of the conductive planes 12, comprises a pair of laterally spaced apart conductive strips separated by a nonconductive spacer layer 42 so that the pair of laterally spaced conductive strips are spaced approximately at the selected width, i.e., the stack width 32. Each of the nonconductive separator layers 20 provides a plurality of vias 22 filled with conductive material 50 conductively joining the two outermost 16', 16''' of the three conductive strips of the one of the conductive layers 16, and the spaced apart conductive strips of the other of the conductive layers 10, and the conductive planes 12, 14 so as to form a conductive sidewall shield about the centermost 16" of the three laterally spaced apart conductive strips.

FIG. 5 is a further embodiment of the construction techniques as described above, but for multiple independent shielded conductors when the constructions are side-by-side but share a common wall. As in the above discussion, the plurality of parallel planar thin film, conductive layers 10 are laid down, where, as defined above, each adjacent pair of the conductive layers 10 is separated by one of the plurality of planar thin film nonconductive separator layers 20 to form the stack of alternating conductive and nonconductive said layers. The initial and the final conductive layers 12, 14 form the top and the bottom conductive planes, the conductive planes establishing the mutually registered selected approximate width 32 of the stack 30.

One of the conductive layers 16 between the top 14 and the bottom 12 conductive planes comprises a plurality of N laterally space apart conductive strips 16', 16", 16''', 16$^{IV}$, 16$^{V}$, 16$^{VI}$ . . . 16$^{N}$, where n is an odd integer. Each laterally adjacent pair of the conductive strips, as for instance, 16' and 16" is separated by the nonconductive spacer layer 40, and the two laterally terminal of the plurality of conductive strips, 16' and 16$^{N}$ are spaced at the selected width 32 of the stack 30.

Each of the other of the conductive layers 10 between the one of the conductive layers 16 and the top one of the conductive planes 14, and between the one of the conductive layers 16 and the bottom one of the conductive planes 12, comprises a plurality of [(N−1)/2]+1 laterally spaced apart conductive strips, where each laterally adjacent pair of the conductive strips is separated by a nonconductive spacer layer 42, the two laterally terminal of the plurality of conductive strips being spaced at the selected width 32 of the stack 30.

The nonconductive separator layers 20 provide the plurality of metal filled vias 22, where the numeral 50 is meant to indicate the metal filling that occurs when the next conductive layer 10 is applied, as described above, positioned for electrically interconnecting the plurality of the conductive strips 10 so as to electrically isolate each of (N−1)/2 of the signal carrying conductive strips 16", 16$^{V}$, 16$^{Vi}$, etc. This enables the placement of any number of fully shielded signal carrying conductors in side-by-side positions on the substrate. Because elongated vias 22 have a limited length, a limitation on the technology, as shown in FIG. 6, they are laid-out as a series of in-line constructions providing electrical interconnection between the metal strips, as previously described, but with spaces 24 where no interconnection metal 50 is able to be deposited.

As shown in FIG. 6, because the vias 22 are generally only able to be fabricated with limited lengths "L", the spaces 24 between adjacent vias 22 of one shield side wall are staggered with respect to the spaces 24 between adjacent vias 22 of the adjacent next side wall so as to provide full isolation between adjacent center conductors 16' and 16" as, for instance, when the constructions defined above are positioned side-by-side on the substrate.

The method of making the on-chip multiple layer metal-shielded monolithic transmission line comprises the steps of forming the plurality of parallel planar thin film, conductive layers 10, by vapor deposition for instance, each in turn, separated by a plurality of planar thin film nonconductive separator layers 20, each also deposited or grown in turn, to form a stack 30 of alternating conductive and nonconductive said layers.

The process further comprises the step of extending, by simple metal deposition, the initial 12 and the final 14 ones of conductive layers, as the top and the bottom conductive planes, to define the mutually registered selected width 32 of the stack 30.

Further, the inventive process includes the step of forming one layer 16, usually the center layer, of the conductive layers 10 between the initial (bottom) and the final (top) conductive planes 12, 14 into a plurality of N laterally spaced apart conductive strips 16', 16", etc., where N is an odd integer. This may be carried out by masking and etching steps as is well known in the art. Each of the adjacent pairs of the conductive strips are separated as well by the same technique so that each laterally adjacent pair of the conductive strips is interposed by a nonconductive spacer layer 40 and spacing the two laterally terminal of the plurality of conductive strips is such as to position then at the selected width 32 of the stack 30 by proper masking and registration steps as is well known in the art.

Likewise, the conductive layers 10 between the one of the conductive layers 16 and the top one 14 of the conductive planes, and between the one of the conductive layers and the bottom one 12 of the conductive planes are separated into a plurality of [(N−1)/2]+1 laterally spaced apart conductive strips as is shown in FIGS. 4 and 5. The vias 22 formed and positioned in nonconductive separator layers upon which metal layers are deposited are filled during the metal deposition process. This constructs a vertically continuous conductive wall to electrically interconnect the plurality of the conductive strips 10 so as to electrically isolate each of the (N−1)/2 signal carrying conductive strips which are positioned, preferentially at the geometric center of the stack, both horizontally and vertically.

The only process requirement is that the number of metal layers, be greater than 3. However, the fine line geometry of the metal used in BiCMOS or a fineline multilayer CMOS process allows the thickness and minimum width of the metal conductor to be on the same order, thereby allowing the conductor to have the characteristics of an on-chip coaxial line. The novel structure is monolithic, exceeds typical isolation requirements, and uses significantly less surface area than microstrip or stripline structures in order to achieve the same isolation characteristics. A unique feature of the implementation is the use of continuous vias so as to encase the center conductor. This feature maintains tight routing while meeting isolation requirements.

The invention provides an isolated on-chip coaxial conductor. Isolation is almost perfect in the present case. This is possible due to the use of multilayer metal and nearly continuous interlayer metal via stacks along ground shield walls of the conductor. In the limit, conductor spacing can be minimized to a shared ground plane consisting of all layers of metal with nearly continuous stacked metal vias between these metal layers. This approach enables large matrix arrays to be implemented as monolithic structures so as to meet stringent isolation requirements while maintaining a relatively small die size. Using multi-layer metal, internal layers can be used as ground planes to provide for the routing of multi-signal paths in a parallel fashion in the x- and y-directions. For example, a five layer metal process allows the placement of signal conductors on metal layers 2 and 4, with ground shielding on layers 1, 3, and 5. (FIG. 3 extended from 3 layers to 5 layers).

In a preferred embodiment, five metal layers are placed and an isolated center conductor is provided. This allows a minimum impact from parasitics. From a symmetry standpoint it allows the coaxial solution. For three or more layers the conductor is placed at the center of the stack of layers. Current fine geometry techniques enable dimensions of the conductor to approximate a coaxial line when shielded. An important feature is the stacked, stretched, multi-layer vias, which enable nearly continuous closure of the center conductor, depending on the yield limits of a particular process technology for vias.

When adjacent conductors do not share a common ground shield, interlayer metal via stacks may be staggered. This approach eliminates any direct coupling between two adjacent conductors. Increasing spacing between ground shields further isolates the signals.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. In the environment of a chip having a plurality of circuit elements, an on-chip multi-layer metal-shielded monolithic transmission line for connecting one of said plurality of circuit elements to another of said plurality of circuit elements, said on-chip multi-layer metal-shielded monolithic transmission line comprising:

a plurality of parallel planar thin film conductive layers; and a plurality of planar thin film nonconductive separator layers disposed such that each adjacent pair of the conductive layers is separated by at least one of said plurality of planar thin film nonconductive layers to provide a stack of alternating conductive and nonconductive layers, wherein an initial one and a final one of said conductive layers provide a top conductive plane and a bottom conductive plane, wherein a center one of the conductive layers comprises three laterally spaced apart conductive strips, said conductive strips separated by nonconductive material such that two laterally spaced terminal strips of the three conductive strips are spaced at a selected width from the center conductive strip thereof, wherein each of the nonconductive separator layers include a plurality of vias between the two laterally spaced terminal conductive strips of the three conductive strips and the top and bottom conductive planes, said plurality of vias filled with conductive material.

2. The invention of claim 1, wherein the center conductive strip provides an electrical signal carrying path.

3. A chip having a plurality of on-chip multi-layer metal-shielded monolithic transmission lines comprising:

a plurality of parallel planar thin film conductive layers, each adjacent pair of the conductive layers separated by at least one of a plurality of planar thin film nonconductive separator layers to provide a stack of alternating conductive and nonconductive said layers, wherein an initial one and a final one of said conductive layers providing a top conductive plane and a bottom conductive plane, wherein one of the conductive layers between the top and the bottom conductive planes includes a plurality of N laterally spaced apart conductive strips, where N is an odd integer, wherein each laterally adjacent pair of the conductive strips are separated at a predetermined width by nonconductive material, wherein the plurality of nonconductive separator layers include a plurality of metal filled vias positioned for electrically interconnecting every other one of the laterally spaced apart conductive strips to the top an bottom conductive planes, wherein the distance between top conductive plane and bottom conductive plane is substantially equal to the distance between every other laterally spaced conductive strips, and wherein the plurality of vias of one of the transmission lines are staggered relative to the plurality of vias of an adjacent one of the transmission lines so as to preclude an electromagnetic line of sight path between the signal carrying conductive strips of the transmission lines.

* * * * *